(12) United States Patent
Shih et al.

(10) Patent No.: US 8,427,230 B2
(45) Date of Patent: Apr. 23, 2013

(54) CURRENT-MODE ANALOG BASEBAND APPARATUS

(75) Inventors: Horng-Yuan Shih, Taipei (TW);
Kai-Cheung Juang, Hsinchu (TW);
Wei-Hsien Chen, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 196 days.

(21) Appl. No.: 12/855,716

(22) Filed: Aug. 13, 2010

(65) Prior Publication Data

US 2012/0019314 A1   Jan. 26, 2012

(30) Foreign Application Priority Data

Jul. 20, 2010   (TW) ............................... 99123835 A

(51) Int. Cl.
*H04B 1/10*   (2006.01)

(52) U.S. Cl.
USPC .......................................... 327/552; 327/558

(58) Field of Classification Search .......... 327/551–553, 327/556–559
See application file for complete search history.

(56) References Cited

U.S. PATENT DOCUMENTS

| | | | |
|---|---|---|---|
| 6,631,170 B1 | 10/2003 | Gu | |
| 6,816,006 B2 * | 11/2004 | Ravatin et al. | 327/553 |
| 6,975,845 B2 | 12/2005 | Vihonen et al. | |
| 7,415,260 B2 | 8/2008 | Stockstad et al. | |
| 7,471,141 B2 * | 12/2008 | Kimura | 327/552 |
| 7,539,476 B2 | 5/2009 | Devries et al. | |
| 7,719,349 B2 * | 5/2010 | Okada | 327/553 |
| 2008/0020725 A1 * | 1/2008 | Demir et al. | 455/232.1 |
| 2008/0284505 A1 * | 11/2008 | Okada | 327/554 |
| 2009/0191833 A1 | 7/2009 | Kaczman et al. | |
| 2012/0019323 A1 * | 1/2012 | Shih et al. | 330/260 |

FOREIGN PATENT DOCUMENTS

| | | |
|---|---|---|
| TW | I311423 | 6/2009 |
| TW | 200931825 | 7/2009 |

OTHER PUBLICATIONS

Ryynanen et al., "A Single-Chip Multimode Receiver for GSM900, DCS1800, PCS 1900, and WCDMA", IEEE J. Solid-State Circuits, vol. 38, No. 4, pp. 594-602, Apr. 2003.
Zhan et al., "A broadband low-cost direct-conversion receiver front-end in 90 nm CMOS", IEEE J. Solid-State Circuits, vol. 43, No. 5, pp. 1132-1137, May 2008.
Ru et al., "Digitally Enhanced Software-Defined Radio Receiver Robust to Out-of Band Interference", IEEE J. Solid-State Circuits, vol. 44, No. 12, pp. 3359-3375, Dec. 2009.
Shih et al., "A 250 MHz 14 dB-NF 73 dB-Gain 82 db-DR Analog Baseband Chain With Digital-Assisted DC-Offset Calibration for Ultra-Wideband", IEEE J. Solid-State Circuits, vol. 45, No. 2, pp. 338-350, Feb. 2010.
C. M. Chang, "Multifunction biquadratic filters using current conveyors", IEEE Transactions on Circuits and Systems-II: Analog and Digital Signal Processing, vol. 44, pp. 956-958, 1997.
A.M. Soliman, "Current conveyor filters: classification and review", Microelectron. J. 29, pp. 133-149, 1998.
Svoboda et al., "A comparison of RC op amp and RC current conveyor filters ", Proceedings of the 36th Midwest Symposium on Circuits and Systems, Aug. 16-18, 1993, p. 1400-p. 1403.
J. A. Svoboda, "Comparison of RC OP-Amp. And RC current conveyor filter", Int. J. Electio., vol. 76, No. 4, Apr. 1994, pp. 615-626.

* cited by examiner

*Primary Examiner* — Patrick O'Neill
(74) *Attorney, Agent, or Firm* — Jianq Chyun IP Office

(57) ABSTRACT

A current-mode analog baseband apparatus is provided. The apparatus includes a current-mode low-order filter, a current-mode programmable gain amplifier (PGA) unit and a high-order filter. The input impedance is smaller than the output impedance in the current-mode low-order filter. An input terminal of the current-mode PGA unit is connected to an output terminal of the current-mode low-order filter. An input terminal of the high-order filter is connected to an output terminal of the current-mode PGA unit.

9 Claims, 11 Drawing Sheets

US 8,427,230 B2

CURRENT-MODE ANALOG BASEBAND APPARATUS

CROSS-REFERENCE TO RELATED APPLICATION

This application claims the priority benefit of Taiwan application serial no. 99123835, filed on Jul. 20, 2010. The entirety of the above-mentioned patent application is hereby incorporated by reference herein and made a part of specification.

BACKGROUND

1. Field of the Disclosure

The disclosure relates to a communication system. More particularly, the disclosure relates to a current-mode analog baseband apparatus.

2. Description of Related Art

In an ultra-wide band (UWB) wireless communication system, signal data is transmitted by orthogonal frequency division multiplexing (OFDM). To decode the signal data at a transceiver end, an analog baseband apparatus demultiplies the signal from radio frequency (RF) to baseband (0-250 MHz), and an analog to digital converter (ADC) is used to convert a baseband signal into a digital signal. During the above operations, a gain of the baseband must be consistent. However, in a present circuit design, a voltage-mode amplifier and a voltage-mode filter cannot be operated over 100 MHz. In a receiver of the UWB system, since the circuit is usually operated in a non-linear zone due to interference signals during a process of demultiplying the signal from the RF to the baseband, it is important to consider linearity. Moreover, with development of the semiconductor fabrication process, a circuit operation voltage becomes lower. Therefore, it is practical and necessary to design an analog baseband apparatus having features of rejecting interference signals, high linearity, and low operation voltage.

In a conventional intermediate frequency (IF) down-conversion design, design difficulties and power consumptions of a variable-gain amplifier and the voltage-mode filter are increased as bandwidths thereof are increased. Although the IF down-conversion can resolve a problem of direct current (DC) offset, other problems are encountered, for example, linearity and power consumption. Therefore, a direction-conversion is still widely used in the UWB system. Anyway, in the present UWB system, the voltage-mode amplifier is used to implement the variable-gain amplifier. An input impedance of the voltage-mode amplifier is the greater the better (which preferably approaches infinity), and an output impedance thereof is the smaller the better (which preferably approaches 0). Contrary to the voltage-mode amplifier, an input impedance of a current-mode amplifier is the smaller the better (which preferably approaches 0), and an output impedance thereof is the greater the better (which preferably approaches infinity). In the present UWB system, the current-mode amplifier is not yet used to implement the variable-gain amplifier.

SUMMARY

The disclosure is directed to an analog baseband apparatus, in which a current-mode structure is used to implement an analog baseband circuit.

The disclosure provides an analog baseband apparatus including a current-mode low-order filter, a first current-mode programmable gain amplifier (PGA) unit and a high-order filter. An input impedance is smaller than an output impedance in the current-mode low-order filter. An input terminal of the first current-mode PGA unit is connected to an output terminal of the current-mode low-order filter. An input terminal of the high-order filter is connected to an output terminal of the first current-mode PGA unit.

According to the above descriptions, regarding a broadband system, the smaller a load resistance is, the wider an operation bandwidth is, and the smaller the load resistance is, the better effect the current transmission is. Therefore, the current-mode low-order filter and the current-mode PGA unit are used to implement the analog baseband circuit, which may have characteristics of broadband and high linearity.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

A present complementary metal-oxide semiconductor (CMOS) amplifier has a high voltage gain. Regarding the amplifier with a fixed current consumption, a multiplication of a gain G and a bandwidth W thereof is a constant C (i.e. G×W=C). Therefore, to obtain a relatively high bandwidth W and relatively high gain G, power consumption has to be increased. However, a baseband requirement of ultra-wide band (UWB) cannot be reached regardless of how greater the power consumption is, so that a method of adding a zero pole to the amplifier is used to increase the multiplication of the gain and the bandwidth. However, when the bandwidth becomes greater (greater than 250 MHz), such method is inapplicable.

Most of the present analog baseband apparatus are constructed based on a circuit principle of V=I×R, and apply a voltage signal transmission mode without using a current signal transmission mode. In the present analog baseband apparatus, a current-mode amplifier is not yet used to implement a variable-gain amplifier and a filter.

Regarding a broadband system, the smaller a load resistance is, the wider an operation bandwidth is, and the smaller the load resistance is, the better effect the current transmission is. Therefore, in the following exemplary embodiments, a current-mode circuit structure is used to implement the UWB analog baseband apparatus. The analog baseband apparatus using the current-mode amplifier has characteristics of broadband and high linearity. Since an applicable bandwidth of the current-mode amplifier can be more than 1 GHz, the analog baseband apparatus can be very competitive in a future ultra-wide band application.

Figure 1:
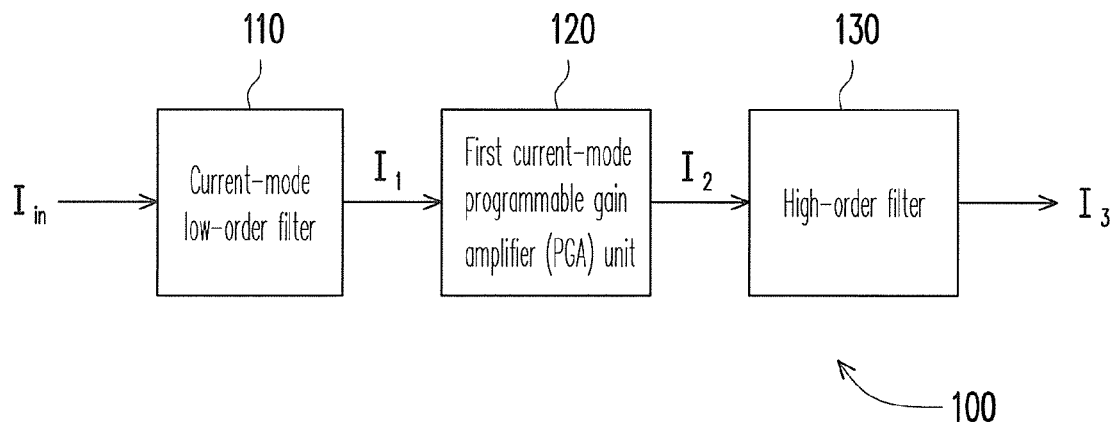
FIG. 1 is a functional block schematic diagram of an analog baseband apparatus according to an exemplary embodiment of the disclosure.

FIG. 1 is a functional block schematic diagram of an analog baseband apparatus 100 according to an exemplary embodiment of the disclosure. The analog baseband apparatus 100 includes a current-mode low-order filter 110, a first current-mode programmable gain amplifier (PGA) unit 120 and a high-order filter 130. An input terminal of the current-mode low-order filter 110 receives a current-mode radio frequency (RF) signal $I_{in}$. An input impedance of the current-mode low-order filter 110 is smaller than an output impedance thereof. The input impedance of the current-mode low-order filter 110 is the smaller the better (which preferably approaches 0), and the output impedance thereof is the greater the better (which preferably approaches infinity).

An input terminal of the first current-mode PGA unit 120 is connected to an output terminal of the current-mode low-order filter 110, and is used for receiving an output signal $I_1$ of the current-mode low-order filter 110. An input impedance of the first current-mode PGA unit 120 is smaller than an output impedance thereof. The input impedance of the first current-mode PGA unit 120 is the smaller the better (which preferably approaches 0), and the output impedance thereof is the greater the better (which preferably approaches infinity).

An input terminal of the high-order filter 130 is connected to an output terminal of the first current-mode PGA unit 120, and is used for receiving an output signal $I_2$ of the first current-mode PGA unit 120. According to different implementations of the high-order filter 130, an output signal $I_3$ can be a voltage-mode signal or a current-mode signal. The high-order filter 130 can be a current-mode filter or a voltage-mode filter of any type. For example, the high-order filter 130 can be a well-known gm-C low-pass filter.

Figure 2:
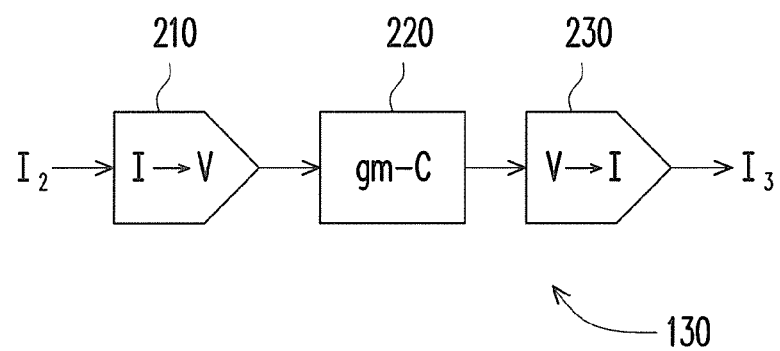
FIG. 2 is a diagram illustrating an implementation of a high-order filter of FIG. 1.

FIG. 2 is a diagram illustrating an implementation of the high-order filter 130 of FIG. 1. The high-order filter 130 may include a current-to-voltage converter 210, a gm-C low-pass filter 220 and a voltage-to-current converter 230. A current input terminal of the current-to-voltage converter 210 is connected to the output terminal of the first current-mode PGA unit 120 for receiving the current-mode output signal $I_2$. An input terminal of the gm-C low-pass filter 220 is connected to a voltage output terminal of the current-to-voltage converter 210 for receiving a voltage-mode output signal. The gm-C low-pass filter 220 may perform a high-order (for example, 6-order) filtering. A voltage input terminal of the voltage-to-current converter 230 is connected to the output terminal of the gm-C low-pass filter 220 for receiving a voltage-mode filtering result. A current output terminal of the voltage-to-current converter 230 is connected to the output terminal of the high-order filter 130 for providing the current-mode output signal $I_3$.

The high-order filter 130 can be a current-mode filter using current conveyors. For example, the current conveyors can be used to form an integrator, and the integrator is used to form the high-order current-mode filter. Such current-mode filter is a well-known technique, so that a detailed description thereof is not repeated herein. An article authored by C. M. Chang, entitled "*Multifunction biquadratic filters using current conveyors*" (IEEE Transactions on Circuits and Systems-II: Analog and Digital Signal Processing, 44, 956-958, 1997), or an article authored by Svoboda, J. A., entitled "*Comparison of RC OP-Amp. And RC current conveyor filter*" (Int. J. ELECTION., 76 (4), pp. 615-626, 1994), or an article authored by SOLIMAN A. M, entitled "*Current conveyor filters: classification and review*" (Microelectron. J., 29, pp. 133-149, 1998), etc. may all be used as references to implement the high-order filter 130 of FIG. 1. The above documents are entirely incorporated by reference herein.

Figure 3A:
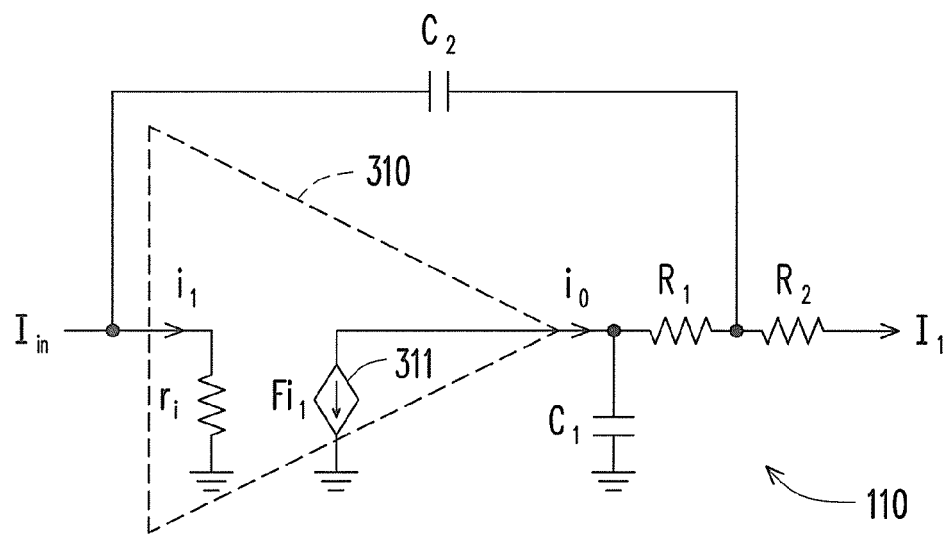
FIG. 3A is a diagram illustrating an implementation of a current-mode low-order filter of FIG. 1.

The current-mode low-order filter 110 of FIG. 1 can be a current-mode low-pass filter of any type, for example, a current-mode Sallen Key (SK) low-pass filter, etc. FIG. 3A is a diagram illustrating an implementation of the current-mode low-order filter 110 of FIG. 1. In FIG. 3A, the circuit of the current-mode low-order filter 110 has a single-ended structure. The current-mode low-order filter 110 includes a current-mode amplifier 310, an output capacitor $C_1$, a feedback capacitor $C_2$, a first resistor $R_1$ and a second resistor $R_2$. The current-mode amplifier 310 can be a current-mode amplifier of any type. Ideally, an input terminal of the current-mode amplifier 310 can be equivalent to an input impedance $r_i$, and an output terminal thereof can be equivalent to a current source 311. If a current flowing through the input impedance $r_i$ is $i_1$, a current of the current source 311 is F times greater than the current $i_1$ (i.e. $F \times i_1$). The input impedance $r_i$ of the current-mode amplifier 310 is smaller than an output impedance thereof (an impedance of the current source 311). The input impedance $r_i$ of the current-mode amplifier 310 is the smaller the better (which preferably approaches 0). The smaller the input impedance $r_i$ is, the better effect the current transmission of the RF signal $I_{in}$ is, and the smaller the input impedance $r_i$ is, the wider an operation bandwidth is.

The input terminal of the current-mode amplifier 310 serves as the input terminal of the current-mode low-order filter 110 for receiving the RF signal $I_{in}$. A first end of the feedback capacitor $C_2$ is connected to the input terminal of the current-mode amplifier 310. A first end of the output capacitor $C_1$ and a first end of the first resistor $R_1$ are all connected to the output terminal of the current-mode amplifier 310. A second end of the first resistor $R_1$ and a first end of the second resistor $R_2$ are all connected to a second end of the feedback capacitor $C_2$. A second end of the second resistor $R_2$ serves as the output terminal of the current-mode low-order filter 110.

Figure 3B:
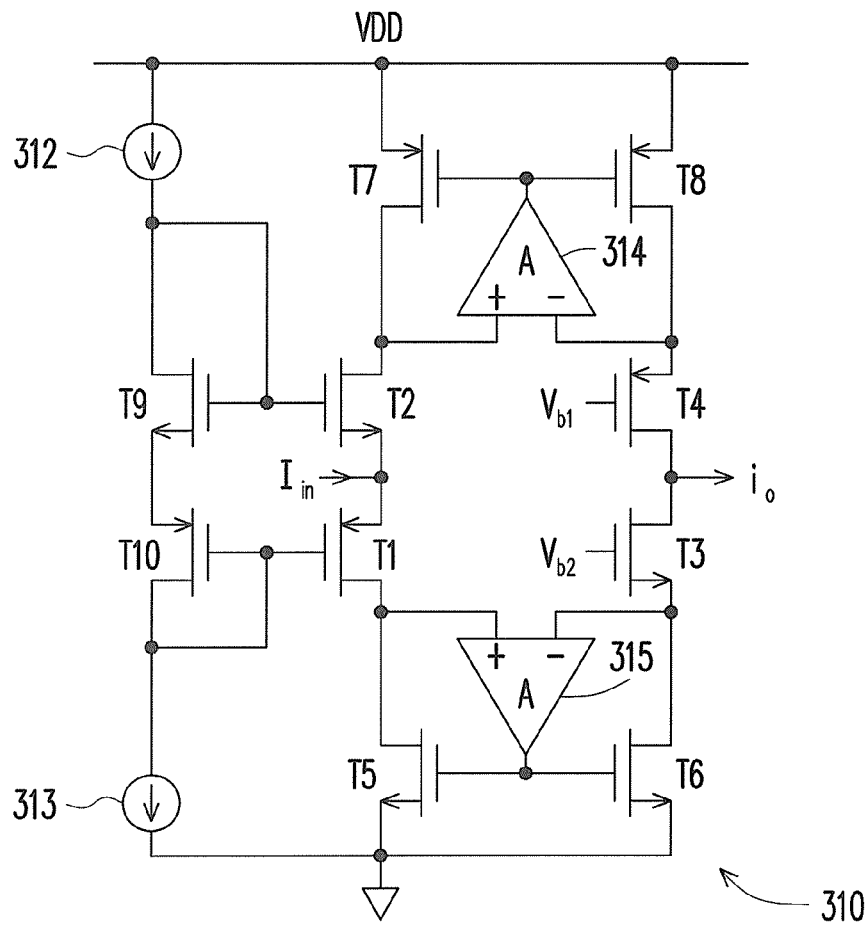
FIG. 3B is a diagram illustrating an implementation of a current-mode amplifier of FIG. 3A.

FIG. 3B is a diagram illustrating an implementation of the current-mode amplifier 310 of FIG. 3A. Referring to FIG. 3B, the current-mode amplifier 310 includes a current source 312, a current source 313, a voltage-mode amplifier 314, a voltage-mode amplifier 315, and transistors T1-T10, wherein the transistors T1, T4, T7, T8 and T10 are P-channel metal oxide semiconductor (PMOS) transistors, and the other transistors are N-channel metal oxide semiconductor (NMOS) transistors. A first end of the current source 312 is connected to a drain of the transistor T9, and a second end of the current source 312 is connected to a power voltage VDD. A gate of the transistor T9 is connected to the drain of the transistor T9, and a source of the transistor T9 is connected to a drain of the transistor T10. A gate of the transistor T10 is connected to a drain of the transistor T10. A first end of the current source 313 is connected to the drain of the transistor T10, and a second end of the current source 313 is connected to a ground voltage.

Sources of the transistors T1 and T2 are connected to the input terminal of the current-mode amplifier 310 for receiving the RF signal A gate of the transistor T2 is connected to the gate of the transistor 19. A drain of the transistor T7 is connected to a drain of the transistor T2. A source of the transistor T7 is connected to the power voltage VDD. An output terminal of the voltage-mode amplifier 314 is connected to gates of the transistors T7 and T8. A non-inverted input terminal of the voltage-mode amplifier 314 is connected to the drain of the transistor T2, and an inverted input terminal of the voltage-mode amplifier 314 is connected to a source of the transistor T4.

A gate of the transistor T1 is connected to the gate of the transistor T10. A drain of the transistor T5 is connected to a drain of the transistor T1, and a source of the transistor T5 is coupled to the ground voltage. An output terminal of the voltage-mode amplifier 315 is connected to gates of the transistors T5 and T6. A non-inverted input terminal of the voltage-mode amplifier 315 is connected to the drain of the transistor T1, and an inverted input terminal of the voltage-mode amplifier 315 is connected to a source of the transistor T3.

A gate of the transistor T6 is connected to the gate of the transistor T5, a source of the transistor T6 is connected to the ground voltage, and a drain of the transistor T6 is connected to the source of the transistor T3. A gate of the transistor T3 receives a bias voltage $V_{b2}$. The gate of the transistor T8 is connected to the gate of the transistor T7. A source of the transistor T8 is connected to the power voltage VDD, and a drain of the transistor T8 is connected to the source of the transistor T4. A gate of the transistor T4 receives a bias voltage $V_{b1}$. Drains of the transistor T3 and T4 are connected to the output terminal of the current-mode amplifier 310 for providing a current $i_o$.

Figure 4:
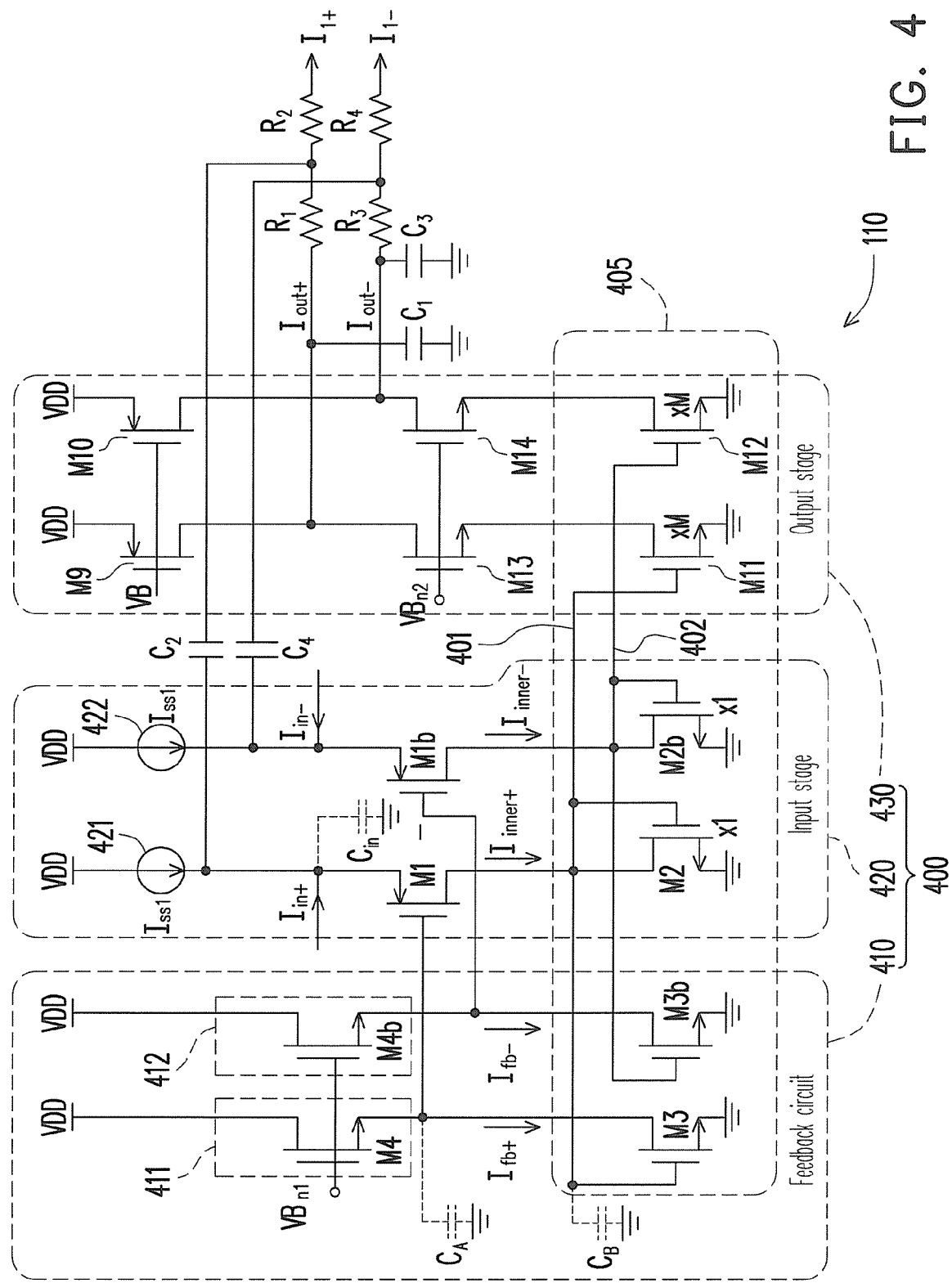
FIG. 4 is a diagram illustrating another implementation of a current-mode low-order filter of FIG. 1.

FIG. 4 is a diagram illustrating another implementation of the current-mode low-order filter 110 of FIG. 1. In FIG. 4, the circuit of the current-mode low-order filter 110 has a double-ended (a differential pair) structure. In the present exemplary embodiment, the RF signal $I_{in}$ of FIG. 1 includes a first RF signal $I_{in+}$ and a second RF signal $I_{in-}$, and the output signal $I_1$ includes a first output signal $I_{1+}$ and a second output signal $I_{1-}$.

The current-mode low-order filter 110 includes a current-mode amplifier 400, a first output capacitor $C_1$, a second output capacitor $C_3$, a first feedback capacitor $C_2$, a second feedback capacitor $C_4$, a first resistor $R_1$, a second resistor $R_2$, a third resistor $R_3$ and a fourth resistor $R_4$. A first input terminal and a second input terminal of the current-mode amplifier 400 serve as the input terminal of the current-mode low-order filter 110 for respectively receiving the current-mode RF signals $I_{in+}$ and $I_{in-}$. A first end of the first feedback capacitor $C_2$ and a first end of the second feedback capacitor $C_4$ are respectively connected to the first input terminal and the second input terminal of the current-mode amplifier 400. A first end of the first output capacitor $C_1$ and a first end of the second output capacitor $C_3$ are respectively connected to a first output terminal and a second output terminal of the current-mode amplifier 400. A first end of the first resistor $R_1$ and a first end of the third resistor $R_3$ are respectively connected to the first output terminal of the current-mode amplifier 400. A second end of the first resistor $R_1$ and a second end of the third resistor $R_3$ are respectively connected to a second end of the first feedback capacitor $C_2$ and a second end of the second feedback capacitor $C_4$. A first end of the second resistor $R_2$ and a first end of the fourth resistor $R_4$ are respectively connected to the second end of the first resistor $R_1$ and the second end of the third resistor $R_3$. A second end of the second resistor $R_2$ and a second end of the fourth resistor $R_4$ respectively serve as the output terminal of the current-mode low-order filter 110 for respectively providing the output signals $I_{1+}$ and $I_{1-}$ to the first current-mode PGA unit 120.

The current-mode amplifier 400 includes a feedback circuit 410, an input stage 420 and an output stage 430. A first input terminal and a second input terminal of the input stage 420 respectively serve as the first input terminal and the second input terminal of the current-mode amplifier 400 for receiving the input currents $I_{in+}$ and $I_{in-}$. The input stage 420 generates corresponding inner currents $I_{inner+}$ and $I_{inner-}$ according to the input currents $I_{in+}$ and feedback currents $I_{fb+}$ and $I_{fb-}$ of the feedback circuit 410. The input stage 420 may use a common gate or common source complementary metal-oxide semiconductor (CMOS) amplifier in collaboration with the feedback circuit 410 to achieve an effect of reducing the input impedance. In other exemplary embodiments, the input stage 420 may use a common base bipolar junction transistor (BJT) amplifier in collaboration with the feedback circuit 410 to achieve the effect of reducing the input impedance.

The feedback circuit 410 is connected to the input stage 420. The feedback circuit 410 generates the corresponding feedback currents $I_{fb+}$ and $I_{fb-}$ according to the inner currents $I_{inner+}$ and $I_{inner-}$ of the input stage 420. In some exemplary embodiments, the feedback circuit 410 can be a trans-impedance amplifier (TIA). A relationship of the inner currents $I_{inner+}$ and $I_{inner-}$, the input currents $I_{in+}$ and $I_{in-}$, and the feedback currents $I_{fb+}$ and $I_{fb-}$ is determined according to a design requirement. For example, the inner current $I_{inner+}$ is a sum of the input current $I_{in+}$ and the feedback current $I_{fb+}$, and the inner current $I_{inner-}$ is a sum of the input current $I_{in-}$ and the feedback current $I_{fb-}$. The feedback circuit 410 may reduce the input impedance of the input stage 420, so as to achieve a purpose of broadband.

A first input terminal and a second input terminal of the output stage 430 are connected to a first output terminal and a second output terminal of the input stage 420. The output stage 430 may mirror the inner currents $I_{inner+}$ and $I_{inner-}$ of the input stage 420 to internal of the output stage 430. A first output terminal and a second output terminal of the output stage 430 respectively serve as the first output terminal and the second output terminal of the current-mode amplifier 400.

In FIG. 4, the input stage 420 includes a current source 421, a current source 422, a transistor M1, a transistor M1b, a transistor M2 and a transistor M2b. In the present embodiment, the transistor M1 and the transistor M1b are PMOS transistors, and the transistor M2 and the transistor M2b are NMOS transistors.

A first end of the current source 421 is connected to a first end (for example, a source) of the transistor M1, and a second end of the current source 421 is connected to a first reference voltage (for example, the power voltage VDD). The first end of the transistor M1 is further connected to the first input terminal of the input stage 420, so that the first end of the transistor M1 may receive a current $I_{ss1}$ of the current source 421 and the first input current $I_{in+}$ of the input stage 420. A first end of the current source 422 is connected to a first end (for example, a source) of the transistor M1b, and a second end of the current source 422 is connected to the first reference voltage. The first end of the transistor M1b is further connected to the second input terminal of the input stage 420, so that the first end of the transistor M1b may receive the current $I_{ss2}$ of the current source 422 and the second input current $I_{in-}$ of the input stage 420.

Control ends (for example, gates) of the transistor M1 and the transistor M1b are controlled by the feedback circuit 410. A second end (for example, a drain) of the transistor M1 is connected to a first end (for example, a drain) of the transistor M2. A control end (for example, a gate) of the transistor M2 is connected to the first end of the transistor M2. A common node of the transistor M2 and the transistor M1 is connected to the first output terminal of the input stage 420 for providing a first inner signal 401 to the output stage 430. A second end (for example, a drain) of the transistor M1b is connected to a first end (for example, a drain) of the transistor M2b. A control end (for example, a gate) of the transistor M2b is connected to the first end of the transistor M2b. A common node of the transistor M2b and the transistor M1b is connected to the second output terminal of the input stage 420 for providing a second inner signal 402 to the output stage 430. Second ends (for example, sources) of the transistor M2 and the transistor M2b are connected to a second reference voltage (for example, the ground voltage).

The feedback circuit 410 includes impedances 411 and 412, a transistor M3 and a transistor M3b. The impedance 411 and the impedance 412 can be impedance devices such as resistors, transistors, or diodes, etc. In the present exemplary embodiment, the impedance 411 includes a transistor M4, and the impedance 412 includes a transistor M4b. In the present exemplary embodiment, the transistor M3, the transistor M3B, the transistor M4 and the transistor M4b are NMOS transistors.

A first end (for example, a drain) of the transistor M4 is connected to the first reference voltage, and a second end (for example, a source) of the transistor M4 is connected to the control end of the transistor M1. A first end (for example, a drain) of the transistor M3 is connected to the second end of the transistor M4, a second end (for example, a source) of the transistor M3 is connected to the second reference voltage, and a control end (for example, a gate) of the transistor M3 is connected to the first end of the transistor M2. The transistor M2 and the transistor M3 form a current mirror, so that the feedback circuit 410 can generate the corresponding feedback current $I_{fb+}$ according to the inner current $I_{inner+}$ of the input stage 420. The transistor M4 may convert the feedback current $I_{fb+}$ into a corresponding control voltage to control the transistor M1, so as to reduce the input impedance of the input stage 420 and achieve the purpose of broadband. By adjusting a bias $VB_{n1}$, a gain of the feedback current $I_{fb+}$ can be changed. In the present exemplary embodiment, a relationship of the inner current $I_{inner+}$, the input current $I_{in+}$ and the feedback current $I_{fb+}$ is $I_{inner+}=I_{in+}+I_{fb+}$.

A first end (for example, a drain) of the transistor M4b is connected to the first reference voltage, and a second end (for example, a source) of the transistor M4b is connected to the control end of the transistor M1b. A first end (for example, a drain) of the transistor M3b is connected to the second end of the transistor M4b, a second end (for example, a source) of the transistor M3b is connected to the second reference voltage, and a control end (for example, a gate) of the transistor M4b is connected to the first end of the transistor M2b. The transistor M2b and the transistor M3b form a current mirror, so that the feedback circuit 410 can generate a corresponding feedback current $I_{fb-}$ according to the inner current $I_{inner-}$ of the input stage 420. The transistor M4b may convert the feedback current $I_{fb-}$ into a corresponding control voltage to control the transistor M1b, so as to reduce the input impedance of the input stage 420 and achieve the purpose of broadband. By adjusting the bias $VB_{n1}$, a gain of the feedback current $I_{fb-}$ can be changed. In the present exemplary embodiment, a relationship of the inner current $I_{inner-}$, the input current $I_{in-}$ and the feedback current $I_{fb-}$ is $I_{inner-}=I_{in-}+I_{fb-}$.

The output stage 430 includes a transistor M9, a transistor M10, a transistor M11, a transistor M12, a transistor M13 and a transistor M14. In the present exemplary embodiment, the transistors M9 and M10 are PMOS transistors, and the transistors M11, M12, M13 and M14 are NMOS transistors. A first end (for example, a drain) of the transistor M9 is connected to the first output terminal of the output stage 430. A first end (for example, a drain) of the transistor M10 is connected to the second output terminal of the output stage 430. Control ends (for example, gates) of the transistors M9 and M10 receive a first bias $VB_{p2}$. Second ends (for example, sources) of the transistors M9 and M10 are connected to the first reference voltage (for example, the power voltage VDD).

A first end (for example, a drain) of the transistor M13 is connected to the first end of the transistor M9, and a second end (for example, a source) of the transistor M13 is connected to a first end (for example, a drain) of the transistor M11. A first end (for example, a drain) of the transistor M14 is connected to the first end of the transistor M10, and a second end (for example, a source) of the transistor M14 is connected to a first end of the transistor M12. Control ends (for example, gates) of the transistors M13 and M14 receive a bias $VB_{n2}$. A control end (for example, a gate) of the transistor M11 is connected to the first input terminal of the output stage 430 for receiving the first inner signal 401. A control end (for example, a gate) of the transistor M12 is connected to the second input terminal of the output stage 430 for receiving the second inner signal 402. Second ends (for example, sources) of the transistors M11 and M12 are connected to the second reference voltage (for example, the ground voltage).

The transistors M2, M2b, M3, M3b, M11 and M12 form the current mirror structure 405. The transistors M2 and M11 form a current minor, wherein channel aspect ratios (or channel width/length ratios W/L) of the transistors M2 and M11 are 1:F. According to the first inner signal 401, the output stage 430 can mirror the inner current $I_{inner+}$ of the input stage 420 to internal of the output stage 430 by a multiplication factor of F. Similarly, the transistors M2b and M12 form another current minor, wherein channel aspect ratios (or channel width/length ratios W/L) of the transistors M2b and M12 are 1:F. According to the second inner signal 402, the output stage 430 can mirror the inner current $I_{inner-}$ of the input stage 420 to internal of the output stage 430 by a multiplication factor of F. By determining the proportional relation of 1:F, a current gain of the output stage 430 can be set. Now, the output stage 430 outputs a first output current signal $I_{out+}$ and a second output current signal $I_{out-}$ according to the inner currents $I_{inner+}$ and $I_{inner-}$ with reference of the above current gain. After the resistors $R_1$, $R_2$, $R_3$ and $R_4$, and the capacitors $C_1$, $C_2$, $C_3$ and $C_4$ filter the current signals $I_{out+}$ and $I_{out-}$, signals $I_{1+}$ and $I_{1-}$ (i.e. the signal $I_1$ of FIG. 1) are output to the first current-mode PGA unit 120.

In summary, based on a local feedback mode of the feedback circuit 410, a low impedance input stage is implemented by the transistors M1, M2, M1b and M2b. The inner currents $I_{inner+}$ and $I_{inner-}$ of the input stage 420 are respectively transmitted (mirrored) to the output stage 430 by a predetermined multiplication factor by using the current mirror structure 405. An input impedance $Z_{in}$ of the current-mode amplifier 400 of FIG. 4 in an s-domain can be represented by a following equation (1):

$$Z_{in} = \frac{1}{g_{m1}} \cdot$$ equation (1)

$$\frac{s^2 C_A C_B + S(C_A g_{m2} + C_B g_{m4}) + (g_{m4}g_{m2} - g_{m1}g_{m3})}{s^3 \frac{C_A C_B C_{in}}{g_{m1}} + s^2 \left[ C_A C_B + \frac{C_{in}}{g_{m1}}(C_A g_{m2} + C_B g_{m4}) \right] +}$$

$$s \left[ C_A g_{m2} + C_B g_{m4} + \frac{C_{in}}{g_{m1}}(g_{m4}g_{m2} - g_{m1}g_{m3}) \right] + g_{m4}g_{m2}$$

Wherein, $g_{m1}$, $g_{m2}$, $g_{m3}$ and $g_{m4}$ respectively represent conductances of the transistors M1, M2, M3 and M4. $C_{in}$ represents a parasitic capacitance of the first input terminal of the input stage 420. A parasitic capacitance $C_A = C_{gs4} \; C_{ds4} \; C_{ds3}$, wherein $C_{gs4}$ represents a parasitic capacitance from the gate to the source of the transistor M4, $C_{ds4}$ represents a parasitic capacitance from the drain to the source of the transistor M4, and $C_{ds3}$ represents a parasitic capacitance from the drain to the source of the transistor M3. A parasitic capacitance $C_B = C_{gs2} \; C_{ds2} \; C_{gs3}$, wherein $C_{gs2}$ represents a parasitic capacitance from the gate to the source of the transistor M2, $C_{ds2}$ represents a parasitic capacitance from the drain to the source of the transistor M2, and $C_{gs3}$ represents a parasitic capacitance from the gate to the source of the transistor M3. In case of a low frequency, the equation (1) can be simplified as:

$$Z_{in,DC} = \frac{1}{g_{m1}} \cdot \left( 1 - \frac{g_{m1}}{g_{m4}} \cdot \frac{g_{m3}}{g_{m2}} \right)$$ equation (2)

Therefore, the input impedance can be reduced through the feedback circuit 410, so as to achieve the purpose of broadband.

In other exemplary embodiments, the transistors M13 and M14 can be omitted, so that the first end of the transistor M11 and the first end of the transistor M12 are respectively connected to the first end of the transistor M9 and the first end of the transistor M10, directly. Moreover, in other exemplary embodiments, the transistors M1, M1b, M9 and M10 show in FIG. 4 can be NMOS transistors, and the other transistors can be PMOS transistors. The drains of the transistor M4 and M4b, the sources of the transistors M9 and M10, and the current sources 421 and 422 can be connected to the ground voltage. The sources of the transistors M3, M3b, M2, M2b, M11 and M12 can be connected to the power voltage VDD.

Figure 5:
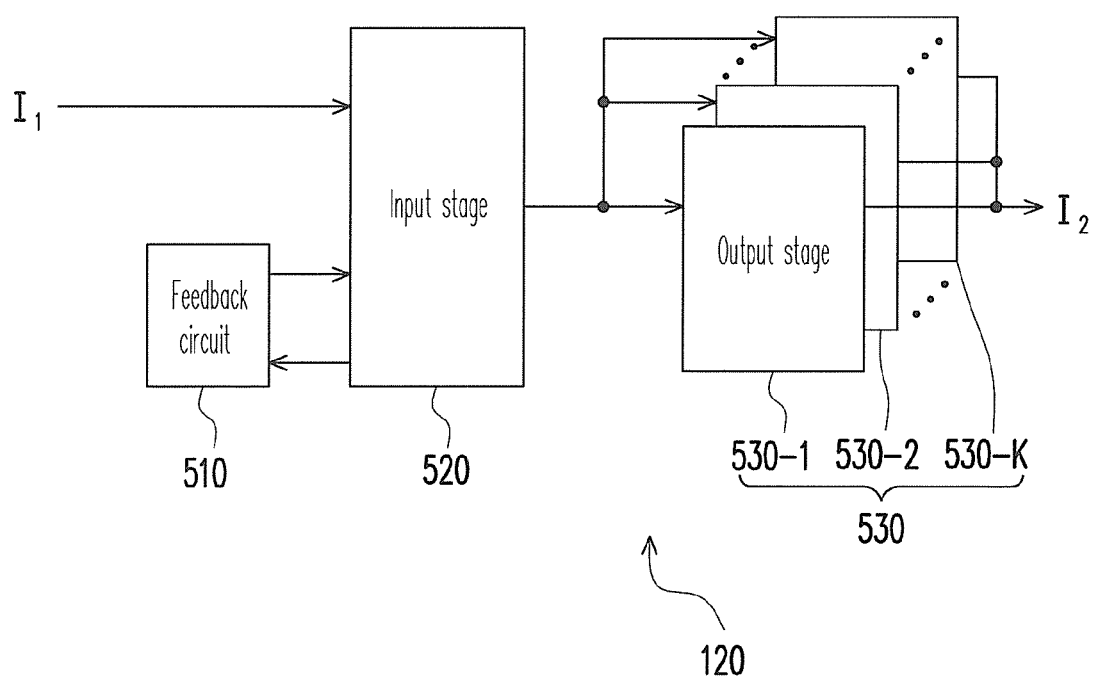
FIG. 5 is a diagram illustrating an implementation of a first current-mode PGA unit of FIG. 1.

FIG. 5 is a diagram illustrating an implementation of the first current-mode PGA unit 120 of FIG. 1. In FIG. 5, a single current-mode amplifier is used to implement the first current-mode PGA unit 120. In other exemplary embodiments, the first current-mode PGA unit 120 can be implemented by a plurality of current-mode amplifiers mutually connected in series.

As shown in FIG. 5, the first current-mode PGA unit 120 includes a feedback circuit 510, an input stage 520 and an output stage 530. The input stage 520 has an input terminal for receiving an input current (the output signal $I_1$ of the current-mode low-order filter 110). The input stage 520 generates a corresponding inner current according to the signal $I_1$ and a feedback current of the feedback circuit 510. The input stage 520 may use a common source complementary metal-oxide semiconductor (CMOS) amplifier in collaboration with the feedback circuit 510 to achieve an effect of reducing the input impedance. In other exemplary embodiments, the input stage 520 may use a common base bipolar junction transistor (BJT) amplifier in collaboration with the feedback circuit 510 to achieve the effect of reducing the input impedance.

The feedback circuit 510 is connected to the input stage 520. The feedback circuit 510 generates the corresponding feedback current according to the inner current of the input stage 520. In some exemplary embodiments, the feedback circuit 510 can be a trans-impedance amplifier (TIA). A relationship of the inner current, the input current $I_1$ and the feedback current is determined according to a design requirement. For example, the inner current is a sum of the input current $I_1$ and the feedback current. The feedback circuit 510 may reduce the input impedance of the input stage 520, so as to achieve a purpose of broadband.

An input terminal of the output stage 530 is connected to an output terminal of the input stage 520. An output terminal of the output stage 530 serves as an output terminal of the current-mode amplifier. The output stage 530 generates a corresponding output current (the output signal $I_2$) according to the inner current of the input stage 520. The output stage 530 has one or a plurality of gain circuits, for example, K gain circuits 530-1, 530-2, ..., 530-K shown in FIG. 5. According to a gain requirement, by controlling a bias voltage of each of the gain circuits 530-1~530-K, a part of the gain circuits is enabled, and the other gain circuits are disabled. By enabling and disabling the gain circuits 530-1~530-K, a gain of the current-mode amplifier is adjusted, so as to achieve a variable gain effect.

Figure 6:
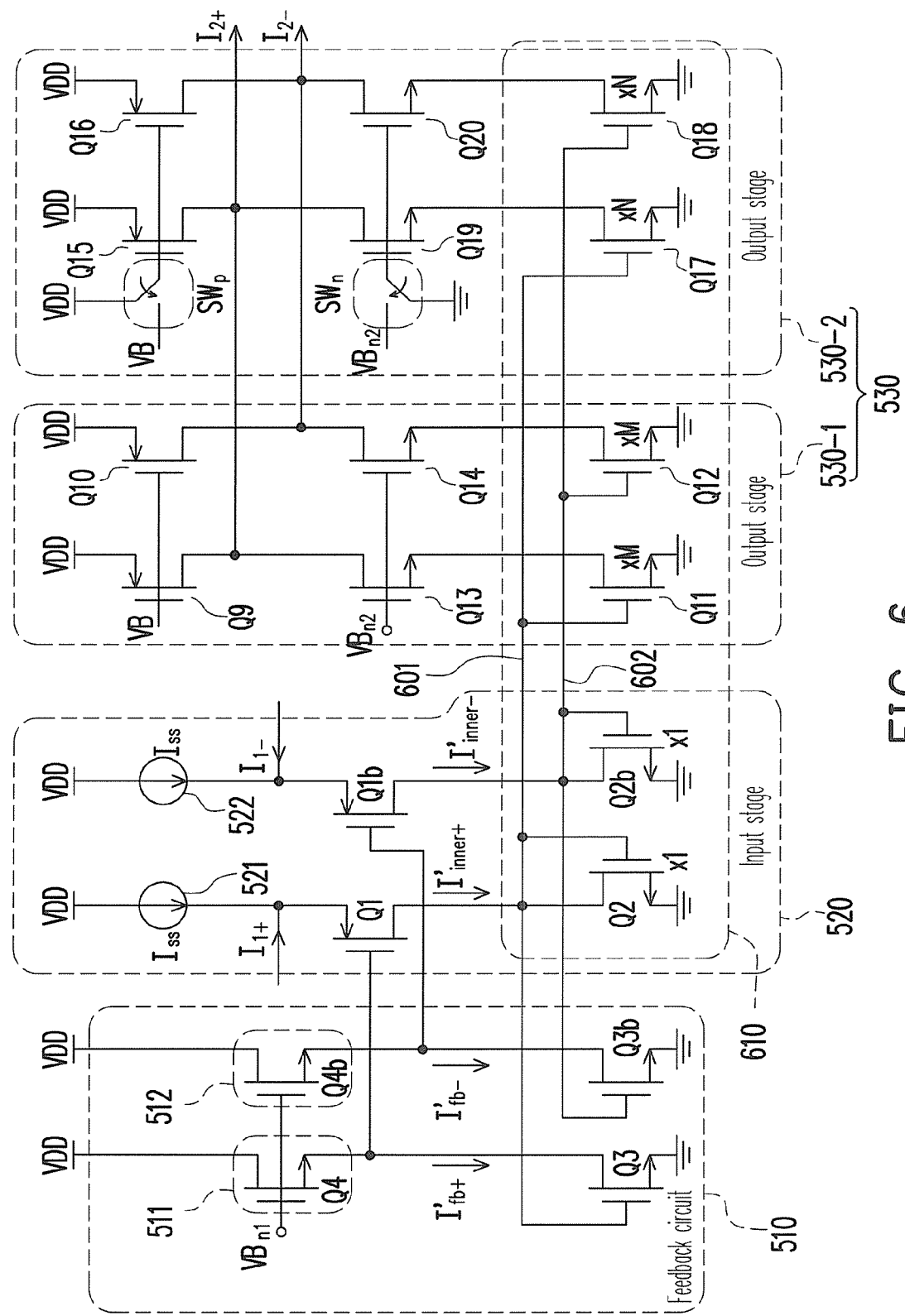
FIG. 6 is a circuit schematic diagram of a current-mode amplifier of FIG. 5 according to an exemplary embodiment of the disclosure.

FIG. 6 is a circuit schematic diagram of the current-mode amplifier of FIG. 5 according to an exemplary embodiment of the disclosure. In the present exemplary embodiment, the input current $I_1$ includes a first input current $I_{1+}$ and a second input current $I_{1-}$, and the output current $I_2$ includes a first output current $I_{2+}$ and a second output current $I_{2-}$. In FIG. 6, two gain circuits 530-1 and 530-2 connected in parallel are used to implement the output stage 530, though a number of the gain circuits can be determined according to an actual design requirement. For example, the gain circuit 530-2 can be omitted, or more gain circuit 530-2 can be applied.

The input terminal of the input stage 520 includes a first input terminal used for receiving the first input current $I_{1+}$ and a second input terminal used for receiving the second input current $I_{2-}$. The output terminal of the input stage 520 include a first output terminal used for providing a first inner signal 601 and a second output terminal used for providing a second inner signal 602. Based on a current mirror structure 610, the input stage 520 may convert a first inner current $I'_{inner+}$ and a second inner current $I'_{inner-}$ into the corresponding first inner signal 601 and the second inner signal 602. The output stage 530 can mirror the inner currents $I'_{inner+}$ and $I'_{inner-}$ of the input stage 520 to internal of the output stage 530 according to the first inner signal 601 and the second inner signal 602.

The input stage 520 includes a first current source 521, a second current source 522, a transistor Q1, a transistor Q1b, a transistor Q2 and a transistor Q2b. In the present exemplary embodiment, the transistors Q1 and Q1b are PMOS transistors, and the transistors Q2 and Q2b are NMOS transistors. A first end of the current source 521 is connected to a first end (for example, a source) of the transistor Q1, a second end of the current source 521 is connected to the first reference voltage (for example, the power voltage VDD). The first end of the transistor Q1 is further connected to the first input terminal of the input stage 520, so that the first end of the transistor Q1 may receive a current Iss of the current source 521 and the first input current $I_{1+}$ of the input stage 520. A first end of the current source 522 is connected to a first end (for example, a source) of the transistor Q1b, and a second end of the current source 522 is connected to the first reference voltage. The first end of the transistor Q1b is further connected to the second input terminal of the input stage 520, so that the first end of the transistor Q1b may receive the current Iss of the current source 522 and the second input current $I_{1-}$ of the input stage 520.

Control ends (for example, gates) of the transistor Q1 and the transistor Q1b are controlled by the feedback circuit 510. A second end (for example, a drain) of the transistor Q1 is connected to a first end (for example, a drain) of the transistor Q2. A control end (for example, a gate) of the transistor Q2 is connected to the first end of the transistor Q2. A common node of the transistor Q2 and the transistor Q1 is connected to the first output terminal of the input stage 520 for providing the first inner signal 601. A second end (for example, a drain) of the transistor Q1b is connected to a first end (for example, a drain) of the transistor Q2b. A control end (for example, a gate) of the transistor Q2b is connected to the first end of the transistor Q2b. A common node of the transistor Q2b and the transistor Q1b is connected to the second output terminal of the input stage 520 for providing the second inner signal 502. Second ends (for example, sources) of the transistor Q2 and the transistor Q2b are connected to the second reference voltage (for example, the ground voltage).

The feedback circuit 510 includes a first impedance 511, a second impedance 512, a transistor Q3 and a transistor Q3b. The first impedance 511 and the second impedance 512 can be impedance devices such as resistors, transistors, or diodes, etc. In the present exemplary embodiment, the first impedance 511 includes a transistor Q4, and the second impedance 512 includes a transistor Q4b. In the present exemplary embodiment, the transistor Q3, the transistor Q3B, the transistor Q4 and the transistor Q4b are NMOS transistors.

A first end (for example, a drain) of the transistor Q4 is connected to the first reference voltage, and a second end (for example, a source) of the transistor Q4 is connected to the control end of the transistor Q1. A first end (for example, a drain) of the transistor Q3 is connected to the second end of the transistor Q4, a second end (for example, a source) of the transistor Q3 is connected to the second reference voltage, and a control end (for example, a gate) of the transistor Q3 is connected to the first end of the transistor Q2. The transistor Q2 and the transistor Q3 form a current mirror, so that the feedback circuit 510 can generate a corresponding feedback current $I'_{fb+}$ according to the inner current $I'_{inner+}$ of the input stage 520. The transistor Q4 may convert the feedback current $I'_{fb+}$ into a corresponding control voltage to control the transistor Q1, so as to reduce the input impedance of the input stage 520 and achieve the purpose of broadband. By adjusting the bias $VB_{n1}$, a gain of the feedback current $I'_{fb+}$ can be changed. In the present exemplary embodiment, a relationship of the inner current $I'_{inner+}$, the input current $I_{1+}$ and the feedback current $I'_{fb+}$ is $F_{inner+}=I_{1+}+I'_{fb+}$.

A first end (for example, a drain) of the transistor Q4b is connected to the first reference voltage, and a second end (for example, a source) of the transistor Q4b is connected to the control end of the transistor Q1b. A first end (for example, a drain) of the transistor Q3b is connected to the second end of the transistor Q4b, a second end (for example, a source) of the transistor Q3b is connected to the second reference voltage, and a control end (for example, a gate) of the transistor Q3b is connected to the first end of the transistor Q2b. The transistor Q2b and the transistor Q3b form a current mirror, so that the feedback circuit 510 can generate a corresponding feedback current $I'_{fb-}$ according to the inner current $I'_{inner-}$ of the input stage 520. The transistor Q4b may convert the feedback current $I'_{fb-}$ into a corresponding control voltage to control the transistor Q1b, so as to reduce the input impedance of the input stage 520 and achieve the purpose of broadband. By adjusting the bias $VB_{n1}$, a gain of the feedback current $I'_{fb-}$ can be changed. In the present exemplary embodiment, a relationship of the inner current $I'_{inner-}$, the input current $I_{1-}$ and the feedback current $I'_{fb-}$ is $I'_{inner-}=I_{1-}+I'_{fb-}$.

The input terminal of the output stage 530 includes a first input terminal used for receiving the first inner signal 601 and a second input terminal used for receiving the second inner signal 602, and the output terminal of the output stage 530 includes a first output terminal used for providing the first output current $I_{2+}$ and a second output terminal used for providing the second output current $I_{2-}$. The gain circuit 530-1 of the output stage 530 includes a transistor Q9, a transistor Q10, a transistor Q11, a transistor Q12, a transistor Q13 and a transistor Q14. In the present exemplary embodiment, the transistors Q9 and Q10 are PMOS transistors, and the transistors Q11, Q12, Q13 and Q14 are NMOS transistors. A first end (for example, a drain) of the transistor Q9 is connected to the first output terminal of the output stage 530 and a first end (for example, a drain) of the transistor Q13. A control end (for example, a gate) of the transistor Q9 receives a first bias VB. A first end (for example, a drain) of the transistor Q10 is connected to the second output terminal of the output stage 530 and a first end (for example, a drain) of the transistor Q14. Second ends (for example, sources) of the transistors Q9 and Q10 are connected to the first reference voltage (for example, the power voltage VDD). A control end (for example, a gate) of the transistor Q10 receives the first bias VB. The first bias VB can be a band-gap reference voltage or a common-mode feedback (CMFB) voltage or other fixed voltages.

Control ends (for example, gates) of the transistors Q13 and Q14 receive the second bias $VB_{n2}$. The second bias $VB_{n2}$ can be a band-gap reference voltage or other fixed voltages. A second end (for example, a source) of the transistor Q13 is connected to a first end (for example, a drain) of the transistor Q11. A second end (for example, a source) of the transistor Q14 is connected to a first end (for example, a drain) of the transistor Q12. A control end (for example, a gate) of the transistor Q11 is connected to the first input terminal of the output stage 530 for receiving the first inner signal 601. A control end (for example, a gate) of the transistor Q12 is connected to the second input terminal of the output stage 530 for receiving the second inner signal 602. Second ends (for example, sources) of the transistors Q11 and Q12 are connected to the second reference voltage (for example, the ground voltage).

The gain circuit 530-2 of the output stage 530 includes a first switch SWp, a second switch SWn, a transistor Q15, a transistor Q16, a transistor Q17, a transistor Q18, a transistor Q19 and a transistor Q20. In the present exemplary embodiment, the transistors Q15 and Q16 are PMOS transistors, and the transistors Q17, Q18, Q19 and Q20 are NMOS transistors. A first end (for example, a drain) of the transistor Q15 is connected to the first output terminal of the output stage 530 and a first end (for example, a drain) of the transistor Q19. A first end (for example, a drain) of the transistor M16 is connected to the second output terminal of the output stage 530 and a first end (for example, a drain) of the transistor Q20. Second ends (for example, sources) of the transistors Q15 and Q16 are connected to the first reference voltage (for example, the power voltage VDD). The first bias VB or the first reference voltage (for example, the power voltage VDD) is selected and transmitted to control ends (for example, gates) of the transistors Q15 and Q16 through the first switch SWp.

A second end (for example, a source) of the transistor Q19 is connected to a first end (for example, a drain) of the transistor Q17. A second end (for example, a source) of the transistor Q20 is connected to a first end (for example, a drain) of the transistor Q18. The second bias $VB_{n2}$ or the second reference voltage (for example, the ground voltage) is selected and transmitted to control ends (for example, gates) of the transistors Q19 and Q20 through the second switch SWn. A control end (for example, a gate) of the transistor Q17 is connected to the first input terminal of the output stage 530 for receiving the first inner signal 601. A control end (for example, a gate) of the transistor Q18 is connected to the second input terminal of the output stage 530 for receiving the second inner signal 602. Second ends (for example, sources) of the transistors Q17 and Q18 are connected to the second reference voltage (for example, the ground voltage).

When the first bias VB is selected and transmitted to the control ends of the transistors Q15 and Q16 through the first switch SWp, and the second bias $VB_{n2}$ is selected and transmitted to the control ends of the transistors Q19 and Q20 through the second switch SWn, a circuit structure of the gain circuit 530-2 is similar to that of the gain circuit 530-1. The transistors Q2, Q2b, Q11, Q12, Q17 and Q18 form the current mirror structure 610. The transistors Q2, Q11 and Q17 form a current mirror, wherein channel aspect ratios (or channel width/length ratios W/L) of the transistors Q2, Q11 and Q17 are 1:M:N. According to the first inner signal 601, the gain circuits 530-1 and the 530-2 can respectively mirror the inner current $I'_{inner+}$ of the input stage 520 to internals of the gain circuits 530-1 and 530-2 by multiplication factors of M and N. The transistors Q2b, Q12 and Q18 form another current mirror, wherein channel aspect ratios (or channel width/length ratios W/L) of the transistors Q2b, Q12 and Q18 are 1:M:N. According to the second inner signal 602, the gain circuits 530-1 and the 530-2 can respectively mirror the inner current $I'_{inner-}$ to internals of the gain circuits 530-1 and 530-2 by multiplication factors of M and N. By determining the proportional relation of 1:M:N, current gains of the gain circuits 530-1 and 530-2 can be set. Now, the gain circuits 530-1 and 530-2 commonly provide the first output current $I_{2+}$ and the second output current $I_{2-}$, namely, the current-mode amplifier has a relatively great output gain.

When the power voltage VDD is selected and transmitted to the control ends of the transistors Q15 and Q16 through the first switch SWp, and the ground voltage is selected and transmitted to the control ends of the transistors Q19 and Q20 through the second switch SWn, the transistors Q15, Q16, Q19 and Q20 are turned off, which is equivalent to a situation that the gain circuit 530-2 is disabled. By turning off the transistors Q15, Q16, Q19 and Q20, it can be ensured that the disabled gain circuit 530-2 does not influence the output currents $I_{2+}$ and $I_{2-}$ of the output stage 530. Now, the first output current $I_{2+}$ and the second output current $I_{2-}$ are provided by the gain circuit 530-1 alone, namely, the current-mode amplifier has a relatively small output gain. Therefore, by controlling the first switch SWp and the second switch SWn, the gain of the current-mode amplifier can be changed, so as to achieve an effect of a variable gain amplifier (VGA).

In other exemplary embodiments, the second switch SWn, the transistors Q13, Q14, Q19 and Q20 can be omitted, so that the drains of the transistors Q11, Q12, Q17 and Q18 can be respectively connected to the drains of the transistors Q9, Q10, Q15 and Q16, directly. Moreover, in other exemplary embodiments, the transistors Q1, Q1b, Q9, Q10, Q15 and Q16 of FIG. 6 can be NMOS transistors, and the other transistors thereof can be PMOS transistors. The drains of the transistors Q4 and Q4b, the sources of the transistors Q9, Q10, Q15 and Q16, and the current sources 521 and 522 can be connected to the ground voltage, and the sources of the transistors Q3, Q3b, Q2, Q2b, Q11, Q12, Q17 and Q18 can be connected to the power voltage VDD.

Figure 7:
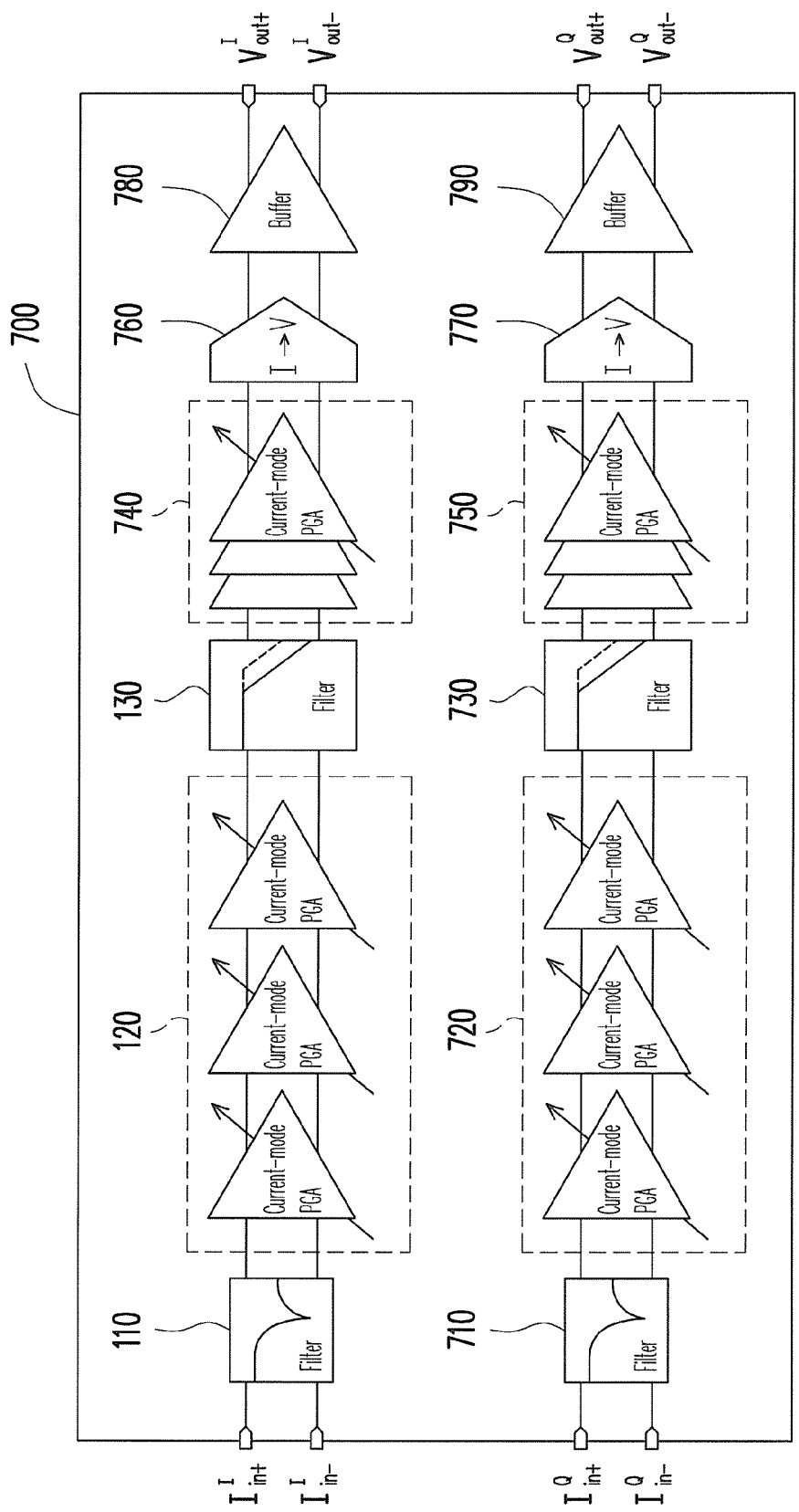
FIG. 7 is a functional block schematic diagram of an analog baseband apparatus according to another exemplary embodiment of the disclosure.

The analog baseband apparatus 100 of FIG. 1 can used to implement an analog baseband structure of a UWB wireless transceiver system, as that shown in FIG. 7. FIG. 7 is a functional block schematic diagram of an analog baseband apparatus 700 according to another exemplary embodiment of the disclosure. The analog baseband apparatus 700 can be widely applied to various wireless/cable broadband systems, and can be used to implement an analog baseband circuit in the broadband system for adjusting a magnitude of a received signal and filter interference signals outside the channels.

The analog baseband apparatus 700 has an in-phase component signal path and a quadrature-phase component signal path. The in-phase component signal path includes the current-mode low-order filter 110, the first current-mode PGA unit 120, the high-order filter 130, a current-mode second PGA unit 740, a current-to-voltage converter 760 and a buffer 780. The in-phase component signal path directly demultiplies a current-mode RF signal pair $I_{in+}^I$ and $I_{in-}^I$ to a voltage-mode baseband signal pair $V_{out+}^I$ and $V_{out-}^I$.

The current-mode low-order filter 110 receives the current-mode RF signal pair $I_{in+}^I$ and $I_{in-}^I$. Implementations of the current-mode low-order filter 110, the first current-mode PGA unit 120, and the high-order filter 130 of FIG. 7 are as that described in the exemplary embodiment of FIG. 1, so that detailed descriptions thereof are not repeated. An input terminal of the second current-mode PGA unit 740 is connected to the output terminal of the high-order filter 130. A current input terminal of the current-to-voltage converter 760 is connected to an output terminal of the second current-mode PGA unit 740. An input terminal of the buffer 780 is connected to a voltage output terminal of the current-to-voltage converter 760. The voltage output terminal of the current-to-voltage converter 760 provides the voltage-mode baseband signal pair $V_{out+}^I$ and $V_{out-}^I$.

The first current-mode PGA unit 120 and the second current-mode PGA unit 740 can be respectively implemented by one or a plurality of current-mode programmable gain amplifiers (PGAs). The current-mode PGAs can be current-mode amplifiers of any type, for example, the current-mode amplifiers shown in FIG. 3B and FIG. 5 or other types of the current amplifiers, etc. Implementation of the first current-mode PGA unit 120 can be the same to that of the second current-mode PGA unit 740. In other exemplary embodiments, implementation of the first current-mode PGA unit 120 can be different to that of the second current-mode PGA unit 740. Moreover, implementation of the current-to-voltage converter 760 is not limited by the disclosure, and any circuit/device capable of converting a current-mode signal into a voltage-mode signal can be used to implement the current-to-voltage converter 760. For example, a current-mode signal may flow through a resistor, and the resistor can be used to convert the current-mode signal into a voltage-mode signal.

The quadrature-phase component signal path includes a second current-mode low-order filter 710, a third current-mode PGA unit 720, a second high-order filter 730, a fourth current-mode PGA unit 750, a second current-to-voltage converter 770 and a second buffer 790. The quadrature-phase component signal path directly demultiplies a current-mode RF signal pair $I_{in+}^Q$ and $I_{in-}^Q$ to a voltage-mode baseband signal pair $V_{out-}^Q$ and $I_{out-}^Q$. Implementations of the second current-mode low-order filter 710, the third current-mode PGA unit 720, the second high-order filter 730, the fourth current-mode PGA unit 750, the second current-to-voltage converter 770 and the second buffer 790 are the same as that of the current-mode low-order filter 110, the first current-mode PGA unit 120, the high-order filter 130, the second current-mode PGA unit 740, the current-to-voltage converter 760 and the buffer 780.

The current-mode low-order filters 110 and 710 first provide a preliminary filtering of the interference signals outside the channels, so as to relax a linearity requirement of the post-stage current-mode PGA units 120 and 720. High-order filtering of the interference signals outside the channels is performed through the high-order filters 130 and 730 in the analog baseband apparatus 700. Based on such configuration, noise and linearity characteristic performance of the whole analog baseband apparatus 700 are simultaneously taken into consideration, so as to achieve an optimal signal-to-noise ratio characteristic.

Figure 8:
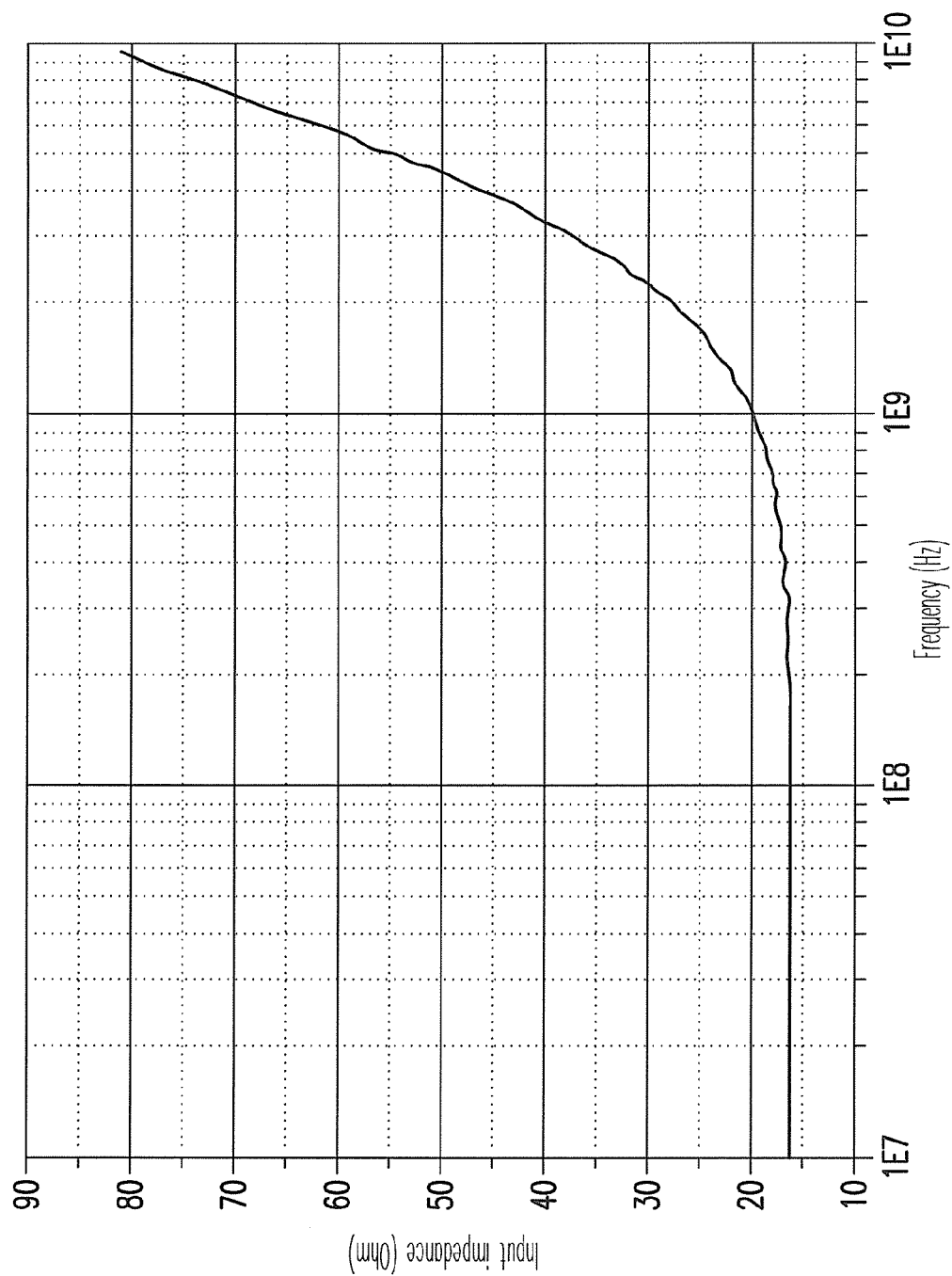
FIG. 8 is a diagram illustrating a simulation result of input impedance of an analog baseband apparatus of FIG. 7.

It is assumed that the current-mode low-order filters 110 and 710 of the analog baseband apparatus 700 are current-mode Sallen-Key (SK) low-pass filters, and the high-order filters 130 and 730 are gm-C low-pass filters. FIG. 8 is a diagram illustrating a simulation result of the input impedance of the analog baseband apparatus 700 of FIG. 7. In FIG. 8, a vertical axis represents the input impedances, and a horizontal axis represents frequencies. According to FIG. 8, it is known that the bandwidth of the analog baseband apparatus 700 may reach 1 GHz.

Figure 9:
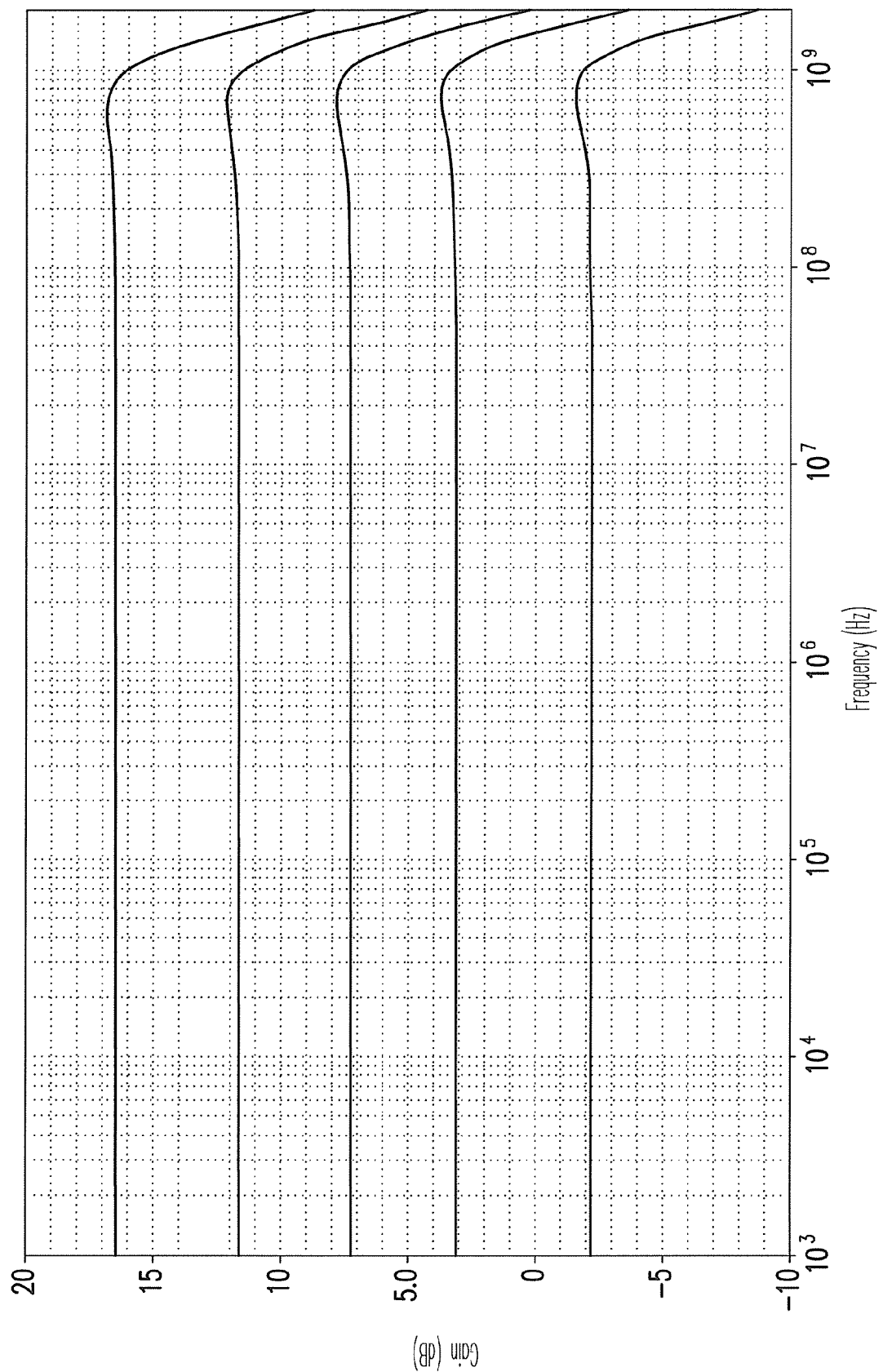
FIG. 9 is a gain frequency response diagram of a current-mode PGA in an analog baseband apparatus of FIG. 7.

FIG. 9 is a gain frequency response diagram of the current-mode PGA (for example, the current-mode amplifiers of FIG. 5 and FIG. 6) of the current-mode PGA unit in the analog baseband apparatus 700 of FIG. 7. In FIG. 9, a vertical axis represents gains, and a horizontal axis represents frequencies. According to FIG. 9, it is known that under different gain modulations, the current-mode amplifier may still maintain the bandwidth of 1 GHz.

Figure 10:
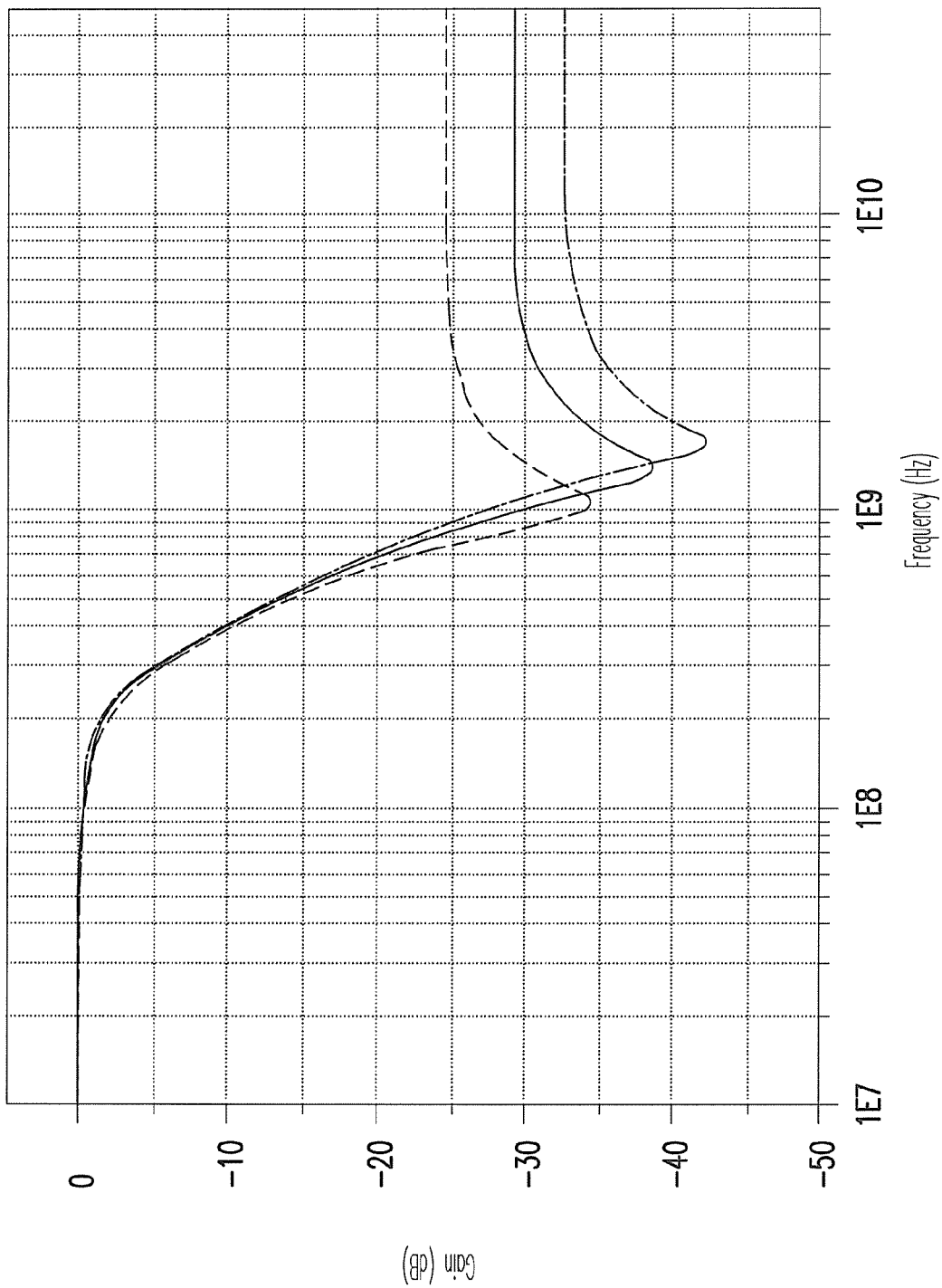
FIG. 10 is a diagram illustrating a frequency response simulation result of a current-mode low-order filter in an analog baseband apparatus of FIG. 7.

FIG. 10 is a diagram illustrating a frequency response simulation result of the current-mode low-order filter 110 in the analog baseband apparatus 700 of FIG. 7. Here, the current-mode low-order filter 110 is a current-mode SK low-pass filter. In FIG. 10, a vertical axis represents gains, and a horizontal axis represents frequencies. According to FIG. 10, it is known that the current-mode low-order filter 110 may preliminarily filter the interference signals outside the channels.

Figure 11:
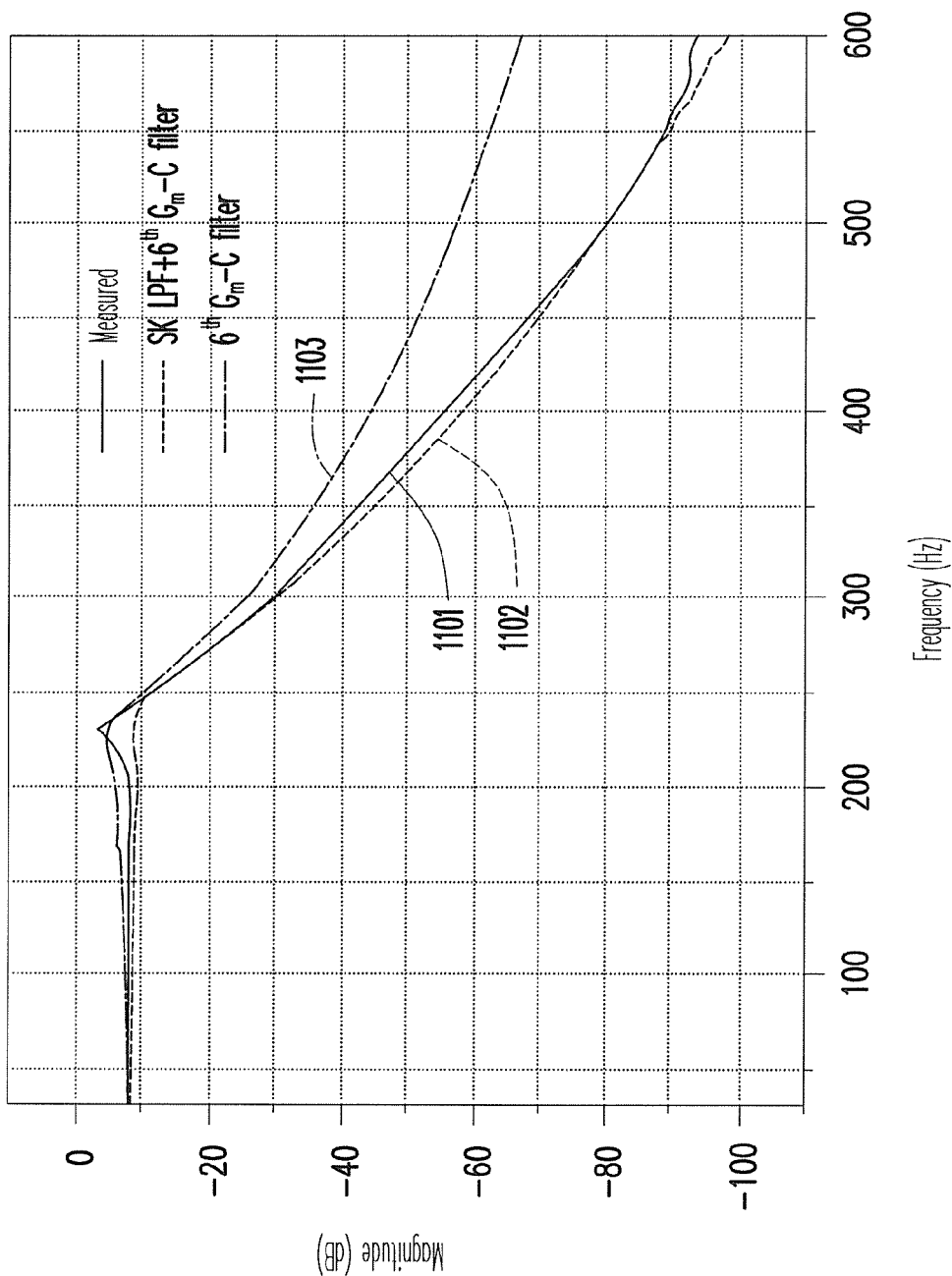
FIG. 11 is a diagram illustrating a whole frequency response simulation and measurement result of an analog baseband apparatus of FIG. 7.

FIG. 11 is a diagram illustrating a whole frequency response simulation and measurement result of the analog baseband apparatus 700 of FIG. 7. In FIG. 11, a vertical axis represents signal magnitudes, and a horizontal axis represents frequencies. Wherein, a curve 1103 is a whole simulation frequency response curve of the analog baseband apparatus 700 in case that the current-mode low-order filters 110 and 710 are omitted, and the gm-C low-pass filters are used to implement the high-order filters 130 and 730. A curve 1102 is a whole simulation frequency response curve of the analog baseband apparatus 700 in case that the current-mode SK low-pass filters are used to implement the current-mode low-order filters 110 and 710, and the gm-C low-pass filters are used to implement the high-order filters 130 and 730. A curve 1101 is an actual measurement frequency response curve of the analog baseband apparatus 700 in case of a same condition of the curve 1102. According to FIG. 11, it is known that the analog baseband apparatus 700 performs the high-order filtering to the interference signals outside the channels.

Figure 12:
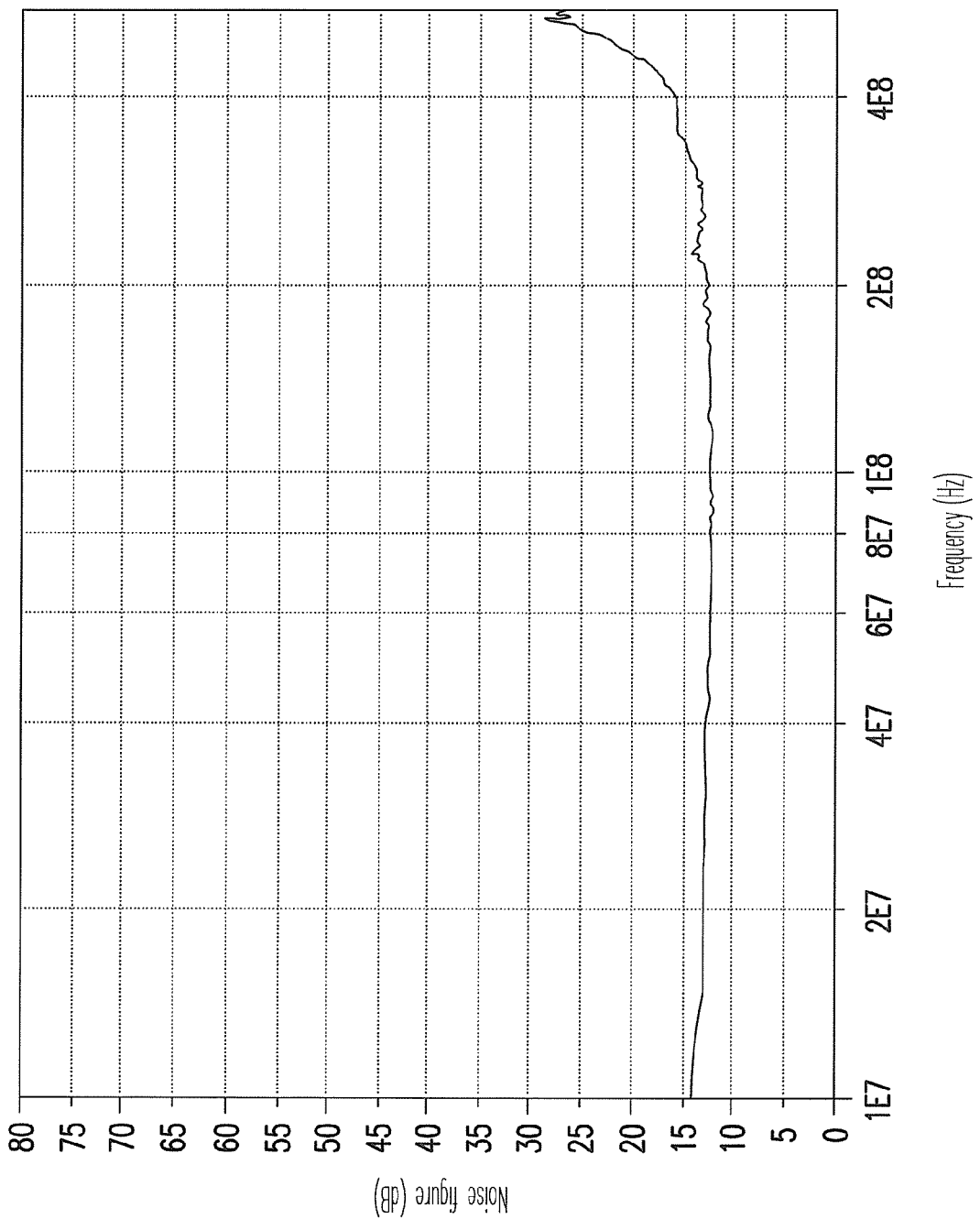
FIG. 12 is a diagram illustrating a whole noise characteristic measurement result of an analog baseband apparatus of FIG. 7.

FIG. 12 is a diagram illustrating a whole noise characteristic measurement result of the analog baseband apparatus 700 of FIG. 7. In FIG. 12, a vertical axis represents a noise figure, and a horizontal axis represents frequencies. According to FIG. 12, it is known that the analog baseband apparatus 700 has a low noise characteristic.

In summary, signals within 250 MHz are amplified according to a broadband feature of the current-mode amplifiers of the above exemplary embodiments, so as to overcome a technical difficulty that the voltage-mode amplifier cannot be operated over 100 MHz. Moreover, a gain control of the current-mode amplifier of the exemplary embodiments is achieved by controlling a current mirror, so that a problem of a gain error influenced by a fabrication variation can be resolved. The analog baseband apparatus of the disclosure is used to amplify the signal received by a receiver to a full-scale of an analog-to-digital converter, so as to reduce a demand for a dynamic range of the analog-to-digital converter, and filter the interference signals outside the channels. The analog baseband apparatus of the disclosure is adapted to be implemented by a circuit with a low operation voltage.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An analog baseband apparatus, comprising:
   a current-mode low-order filter, configured to receive and process a current-mode RF differential signal, so as to output a first current-mode output differential signal, wherein an input impedance of the current-mode low-order filter is smaller than an output impedance thereof;
   a first current-mode programmable gain amplifier (PGA) unit, having an input terminal connected to an output terminal of the current-mode low-order filter, configured to receive and process the first current-mode differential output signal, so as to output a second current-mode differential output signal; and
   a high-order filter, having an input terminal connected to an output terminal of the first current-mode PGA unit, configured to receive and process the second current-mode differential output signal, so as to output a third current-mode differential output signal.

2. The analog baseband apparatus as claimed in claim 1, wherein the current-mode low-order filter comprises:
   a current-mode amplifier, having a first input terminal and a second input terminal serving as input terminals of the current-mode low-order filter;
   a first feedback capacitor, having a first end connected to the first input terminal of the current-mode amplifier;
   a second feedback capacitor, having a first end connected to the second input terminal of the current-mode amplifier;
   a first output capacitor, having a first end connected to a first output terminal of the current-mode amplifier;
   a second output capacitor, having a first end connected to a second output terminal of the current-mode amplifier;
   a first resistor, having a first end connected to the first output terminal of the current-mode amplifier, and a second end connected to a second end of the first feedback capacitor;
   a second resistor, having a first end connected to the second end of the first resistor;
   a third resistor, having a first end connected to the second output terminal of the current-mode amplifier, and a second end connected to a second end of the second feedback capacitor; and
   a fourth resistor, having a first end connected to the second end of the third resistor, and second ends of the second resistor and the fourth resistor serve as the output terminal of the current-mode low-order filter.

3. The analog baseband apparatus as claimed in claim 2, wherein the current-mode amplifier comprises:
- an input stage, having a first input terminal and a second input terminal respectively serving as the first input terminal and the second input terminal of the current-mode amplifier for receiving an input current corresponding to the current-mode RF differential signal, wherein the input stage generates an inner current according to the input current and a feedback current;
- an output stage, having a first input terminal and a second input terminal connected to the a first output terminal and a second output terminal of the input stage, and a first output terminal and a second output terminal respectively serving as the first output terminal and the second output terminal of the current-mode amplifier; and
- a feedback circuit, connected to the input stage, for generating the feedback current according to the inner current of the input stage.

4. The analog baseband apparatus as claimed in claim 3, wherein the inner current is a sum of the input current and the feedback current.

5. The analog baseband apparatus as claimed in claim 3, wherein the input stage comprises:
- a first current source;
- a second current source;
- a first transistor, having a first end connected to a first end of the first current source, and a control end controlled by the feedback circuit, wherein a common node of the first transistor and the first current source is connected to the first input terminal of the input stage;
- a second transistor, having a first end connected to a first end of the second current source, and a control end controlled by the feedback circuit, wherein a common node of the second transistor and the second current source is connected to the second input terminal of the input stage;
- a third transistor, having a first end connected to a second end of the first transistor, and a control end connected to the first end of the third transistor, wherein a common node of the third transistor and the first transistor is connected to the first output terminal of the input stage; and
- a fourth transistor, having a first end connected to a second end of the second transistor, and a control end connected to the first end of the fourth transistor, wherein a common node of the fourth transistor and the second transistor is connected to the second output terminal of the input stage.

6. The analog baseband apparatus as claimed in claim 5, wherein the feedback circuit comprises:
- a first impedance, having a first end connected to a first reference voltage, and a second end connected to the control end of the first transistor;
- a second impedance, having a first end connected to the first reference voltage, and a second end connected to the control end of the second transistor;
- a fifth transistor, having a first end connected to the second end of the first impedance, a second end connected to a second reference voltage, and a control end connected to the first end of the third transistor; and
- a sixth transistor, having a first end connected to the second end of the second impedance, a second end connected to the second reference voltage, and a control end connected to the first end of the fourth transistor.

7. The analog baseband apparatus as claimed in claim 6, wherein the first impedance comprises a seventh transistor, and the second impedance comprises an eighth transistor.

8. The analog baseband apparatus as claimed in claim 3, wherein the output stage comprises:
- a ninth transistor, having a first end connected to the first output terminal of the output stage, and a control end receiving a first bias;
- a tenth transistor, having a first end connected to the second output terminal of the output stage, and a control end receiving the first bias;
- an eleventh transistor, having a first end connected to the first end of the ninth transistor, and a control end connected to the first input terminal of the output stage; and
- a twelfth transistor, having a first end connected to the first end of the tenth transistor, and a control end connected to the second input terminal of the output stage.

9. The analog baseband apparatus as claimed in claim 3, wherein the output stage comprises:
- a ninth transistor, having a first end connected to the first output terminal of the output stage, and a control end receiving a first bias;
- a tenth transistor, having a first end connected to the second output terminal of the output stage, and a control end receiving the first bias;
- an eleventh transistor, having a control end connected to the first input terminal of the output stage;
- a twelfth transistor, having a control end connected to the second input terminal of the output stage;
- a thirteenth transistor, having a first end connected to the first end of the ninth transistor, a second end connected to a first end of the eleventh transistor, and a control end receiving a second bias; and
- a fourteenth transistor, having a first end connected to the first end of the tenth transistor, a second end connected to a first end of the twelfth transistor, and a control end receiving the second bias.

* * * * *